United States Patent
Voo

(10) Patent No.: US 8,076,969 B1
(45) Date of Patent: *Dec. 13, 2011

(54) APPARATUS FOR ATTENUATING LOW FREQUENCY SIGNALS

(75) Inventor: Thart Fah Voo, Singapore (SG)

(73) Assignee: Marvell International, Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/413,654

(22) Filed: Mar. 30, 2009

Related U.S. Application Data

(63) Continuation of application No. 11/582,906, filed on Oct. 18, 2006, now Pat. No. 7,514,990.

(60) Provisional application No. 60/793,863, filed on Apr. 21, 2006.

(51) Int. Cl.
*H03K 5/00* (2006.01)

(52) U.S. Cl. .................... 327/553; 327/552; 327/559

(58) Field of Classification Search ........... 327/551–559
See application file for complete search history.

(56) References Cited

U.S. PATENT DOCUMENTS

| | | | | |
|---|---|---|---|---|
| 4,589,136 A * | 5/1986 | Poldy et al. | ................. | 381/94.2 |
| 5,760,642 A | 6/1998 | Yada | | |
| 6,496,341 B1 * | 12/2002 | Chen et al. | ..................... | 361/56 |
| 7,317,601 B2 * | 1/2008 | Chen | ................. | 361/56 |
| 7,440,209 B1 * | 10/2008 | Sutardja | ........................ | 360/46 |

* cited by examiner

*Primary Examiner* — Dinh T. Le

(57) ABSTRACT

A high pass filter has a cutoff frequency. The high pass filter includes a first amplifier to receive an input signal. The high pass filter attenuates low frequency signals of the input signal that are below the cutoff frequency. A second amplifier provides an output signal. The output signal comprising only high frequency signals of the input signal that are above the cutoff frequency. A capacitive element is coupled in between the first amplifier and the second amplifier. A variable frequency module controls a plurality of resistive paths of the high pass filter. Each resistive path corresponds to a different cutoff frequency for the high pass filter. The variable frequency module is configured to prevent any leakage current from draining the capacitive element.

17 Claims, 14 Drawing Sheets

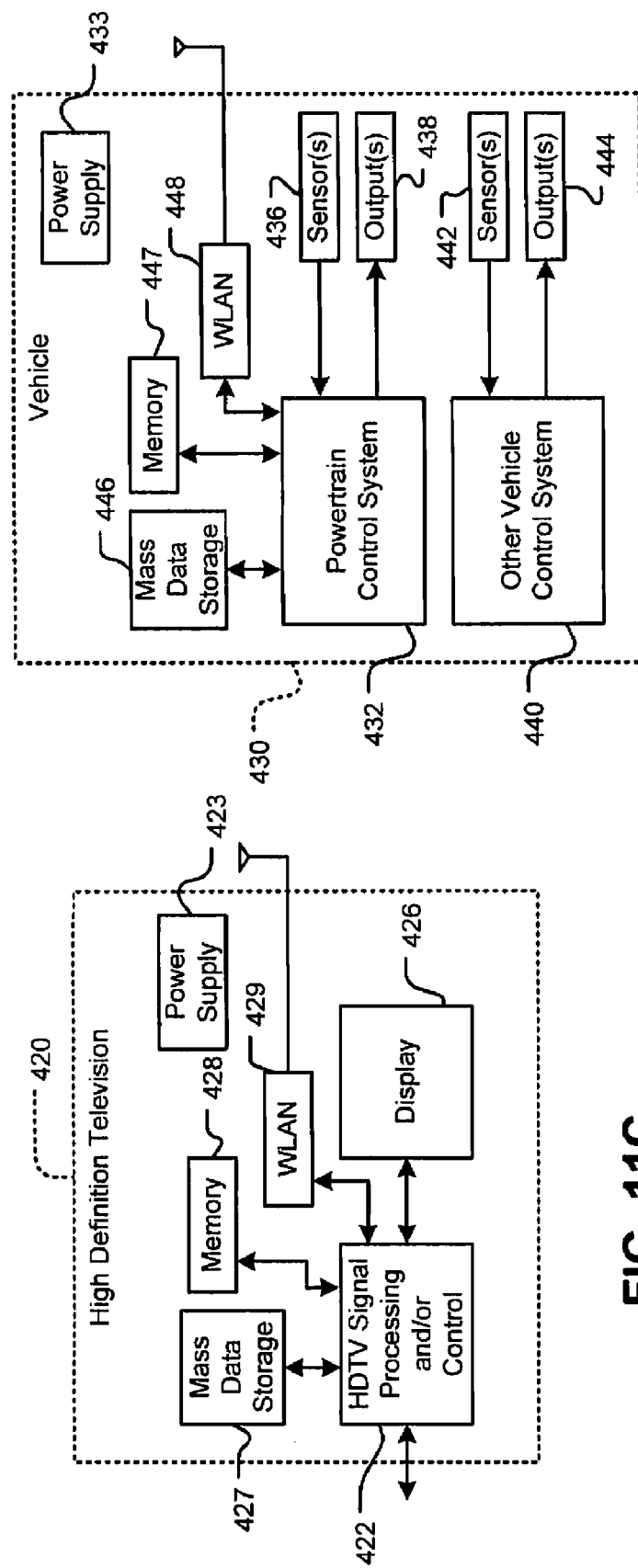

APPARATUS FOR ATTENUATING LOW FREQUENCY SIGNALS

CROSS-REFERENCE TO RELATED APPLICATIONS

This application is a continuation of U.S. patent application Ser. No. 11/582,906, filed Oct. 18, 2006, which claims the benefit of U.S. Provisional Application No. 60/793,863, filed Apr. 21, 2006. The disclosures of the above applications are incorporated herein by reference.

FIELD

The present invention relates generally to high pass filters.

BACKGROUND

High pass filters pass high frequency signals above a cutoff frequency and attenuate low frequency signals below the cutoff frequency. High pass filters typically cannot achieve very low cutoff frequencies due to diode leakage current.

Referring now to FIG. 1, a high-pass filter 10 with amplifiers $Amp_1$, $Amp_2$ is shown. A capacitor $C_{HP}$ is connected to an output of $Amp_1$, and an input of $Amp_2$. Resistors $R_1$, $R_2$, . . . , and $R_n$ are connected in parallel to one end of the capacitor $C_{HP}$ and the input of $Amp_2$, and to a source node of transistors $M_1$, $M_2$, . . . , and $M_n$ and a cathode of diodes $D_{11}$, $D_{21}$, . . . , and $D_{n1}$. A source node of transistor $M_{CH}$ is connected to one end of the capacitor $C_{HP}$ and the input of $Amp_2$, and to a cathode of diode $D_{o1}$. A drain node of transistors $M_1$, $M_2$, . . . , $M_n$, and $M_{CH}$ is connected to a cathode of diodes $D_{12}$, $D_{22}$, . . . , $D_{n2}$, and $D_{o2}$ and to the reference node $V_{REF}$. The anodes of diodes $D_{11}$, $D_{21}$, . . . , $D_{n1}$, $D_{12}$, $D_{22}$, . . . , $D_{n2}$, $D_{o1}$, and $D_{o2}$ are connected to ground.

The transistors $M_1$, $M_2$, . . . , $M_n$, and $M_{CH}$ receive control signals $MSW_1$, $MSW_2$, . . . , $MSW_n$, and CLK, respectively, which control transistors $M_1$, $M_2$, . . . , $M_n$, and $M_{CH}$. Transistors $M_1$, $M_2$, . . . , and $M_n$ open or close bias networks 20 of different resistances based on a desired cutoff frequency of the high-pass filter. A time constant, $\tau = RC_{HP}$, is inversely proportional to a cutoff frequency. The cutoff frequency represents the frequency at which the output power is half the input power. The transistor $M_{CH}$ is controlled by the clock signal CLK and is used to charge the capacitor $C_{HP}$ using voltage $V_{REF}$ during initialization. For example, the resistance through paths $R_1$, $R_2$, . . . , and $R_n$ may be too large, thereby increasing a time to charge capacitor $C_{HP}$.

Referring now to FIG. 2, a bias network 20 of the high pass filter 10 is shown in more detail. For example, the bias network 20 includes an NMOS transistor $M_1$ fabricated using a twin-well process. A resistor $R_1$ is connected at one end to a communication node $V_C$, and at the other end to a source of the transistor $M_1$ and a cathode of a diode $D_{11}$. The drain of transistor $M_1$ is connected to a cathode of diode $D_{12}$ and a reference node $V_{REF1}$. Control signal $MSW_1$ controls the switching of transistor $M_1$. Anodes of diodes $D_1$, $D_{12}$ are connected to an anode of diode $D_{13}$. A cathode of diode $D_{13}$ is connected to a second reference node $V_{REF2}$ and to a cathode of diode $D_{14}$. An anode of diode $D_{14}$ is connected to ground.

Referring now to FIG. 3, a cross-sectional view of an NMOS transistor 30 created using a twin-well process is shown. A deep n-well 34 is formed in a p-type substrate 32. A p-well 36 is formed in the deep n-well 34. An n+ source region 38 and an n+ drain region 40 are formed in the p-well 36. Diodes $D_{11}$-$D_{14}$ are inherent in regions between n-type and p-type regions (i.e. p-n junctions). For example, current flows from the p-type side (the anode) to the n-type side (the cathode). In other words, a diode $D_{11}$ is inherently present in the region 42 between the source 38 and the p-well 36. Similarly, a diode $D_{12}$ is inherently present in the region 44 between the drain 40 and the p-well 36. A diode $D_{13}$ is inherently present in the region 46 between the p-well 36 and the deep n-well 34. A diode $D_{14}$ is inherently present in the region 48 between the deep n-well 34 and the p-type substrate 32.

SUMMARY

A variable frequency module controls a cutoff frequency of a high pass filter and includes a resistive element that communicates with a capacitive element of the high pass filter. A first transistor communicates with the resistive element and a reference node and includes a first source/drain region formed in a first well region and a first diode region formed between the first source/drain region and the first well region. A first node of the first diode region is connected to the first source/drain region and the reference node, and a second node of the first diode region is connected to the reference node.

In other features the first transistor further includes a first contact region formed in the first well region that is connected to the first source/drain region and the first well region. The first transistor further includes a second diode region formed between a second source/drain region and the first well region. A first node of the second diode region is connected to the second source/drain region, and a second node of the second diode region is connected to the second node of the first diode region and the reference node.

In other features a second transistor communicates with the capacitive element and the reference node and includes a third source/drain region formed in a second well region and a third diode region formed between the third source/drain region and the second well region. A first node of the third diode region is connected to the third source/drain region and the reference node, and a second node of the third diode region is connected to the reference node. The second transistor further includes a second contact region formed in the second well region that is connected to the third source/drain region and the second well region. The second transistor further includes a fourth diode formed between a fourth source/drain region and the second well region. A first node of the fourth diode region is connected to the fourth source/drain region, and a second node of the fourth diode region is connected to the second node of the third diode region and the reference node. The first transistor and the second transistor are of a twin-well design.

In other features the variable frequency module receives a reference voltage signal. The reference node receives the reference voltage signal.

In other features the variable frequency module includes an input signal and an output signal. A first node of the capacitive element receives the input signal, a second node of the capacitive element communicates with a communication node of the variable frequency module, and the output signal is generated at the second node of the capacitive element. The first transistor receives a program signal. The second transistor receives a clock signal.

A variable frequency module that controls a cutoff frequency of a high pass filter includes a resistive element that communicates with a capacitive element of the high pass filter. A transistor includes a source/drain region formed in a well region, a diode region formed between the source/drain region and the well region, and a contact region formed in the well region. The contact region is connected to the source/ drain region, the well region, and a reference voltage.

In other features the resistive element includes N resistors and further the variable frequency module further includes N−1 of the transistors. First ends of each of the N resistors are connected together. Second ends of each of the N resistors communicate with a respective one of the N transistors. N is an integer greater than or equal to 2.

In other features the variable frequency module further includes N additional resistive elements and N additional transistors that each include a source/drain region formed in a well region, a diode region formed between the source/drain region and the well region, and a contact region formed in the well region. A first end of each of the N additional resistive elements connects to an associated one of the N additional transistors and a second end of each of the N additional resistive elements connects to an adjacent one of the N+1 transistors and wherein N is an integer greater than or equal to 1. The transistors are NMOS transistors and/or PMOS transistors.

A variable frequency module that controls a cutoff frequency of a high pass filter includes resistive means for communicating with a capacitive means for providing a capacitance of the high pass filter. First transistor means communicate with the resistive means and a reference node and include a first source/drain region formed in a first well region and a first diode region formed between the first source/drain region and the first well region. A first node of the first diode region is connected to the first source/drain region and the reference node, and a second node of the first diode region is connected to the reference node.

In other features the first transistor means further includes a first contact region formed in the first well region that is connected to the first source/drain region and the first well region. The first transistor means further includes a second diode region formed between a second source/drain region and the first well region. A first node of the second diode region is connected to the second source/drain region, and a second node of the second diode region is connected to the second node of the first diode region and the reference node.

In other features the variable frequency module further includes second transistor means for communicating with the capacitive means and the reference node and includes a third source/drain region formed in a second well region and a third diode region formed between the third source/drain region and the second well region. A first node of the third diode region is connected to the third source/drain region and the reference node, and a second node of the third diode region is connected to the reference node. The second transistor means further includes a second contact region formed in the second well region that is connected to the third source/drain region and the second well region. The second transistor means further includes a fourth diode formed between a fourth source/drain region and the second well region. A first node of the fourth diode region is connected to the fourth source/drain region, and a second node of the fourth diode region is connected to the second node of the third diode region and the reference node. The first transistor means and the second transistor means are of a twin-well design.

In other features the variable frequency module receives a reference voltage signal. The reference node receives the reference voltage signal. The variable frequency module also includes an input signal and an output signal. A first node of the capacitive means receives the input signal, a second node of the capacitive means communicates with a communication node of the variable frequency module, and the output signal is generated at the second node of the capacitive means. The first transistor means receives a program signal. The second transistor means receives a clock signal.

A variable frequency module controls a cutoff frequency of a high pass filter and includes resistive means for communicating with capacitive means for providing a capacitance of the high pass filter. Transistor means for communicating with the resistive means include a source/drain region formed in a well region, a diode region formed between the source/drain region and the well region, and a contact region formed in the well region. The contact region is connected to the source/ drain region, the well region, and a reference voltage.

In some features the resistive means includes N resistor means for providing resistances and the variable frequency module further includes N−1 transistor means for communicating with respective ones of the N resistor means. Each of the N resistor means are connected together. Second ends of each of the N resistor means communicates with a respective one of the N transistor means. N is an integer greater than or equal to 2.

In some embodiments the variable frequency module further includes N additional resistive means for providing resistances and N additional transistor means for controlling current that flows through the N additional resistive means. Each of the N additional transistor means includes a source/drain region formed in a well region, a diode region formed between the source/drain region and the well region, and a contact region formed in the well region. A first end of each of the N additional resistive means connects to an associated one of the N additional transistor means and a second end of each of the N additional resistive means connects to an adjacent one of the N+1 transistor means. N is an integer greater than or equal to 1. Each of the N+1 transistor means implements an NMOS and/or PMOS transistor.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 11C is a functional block diagram of a high definition television;

FIG. 11D is a functional block diagram of a vehicle control system;

DETAILED DESCRIPTION

Figure 1:
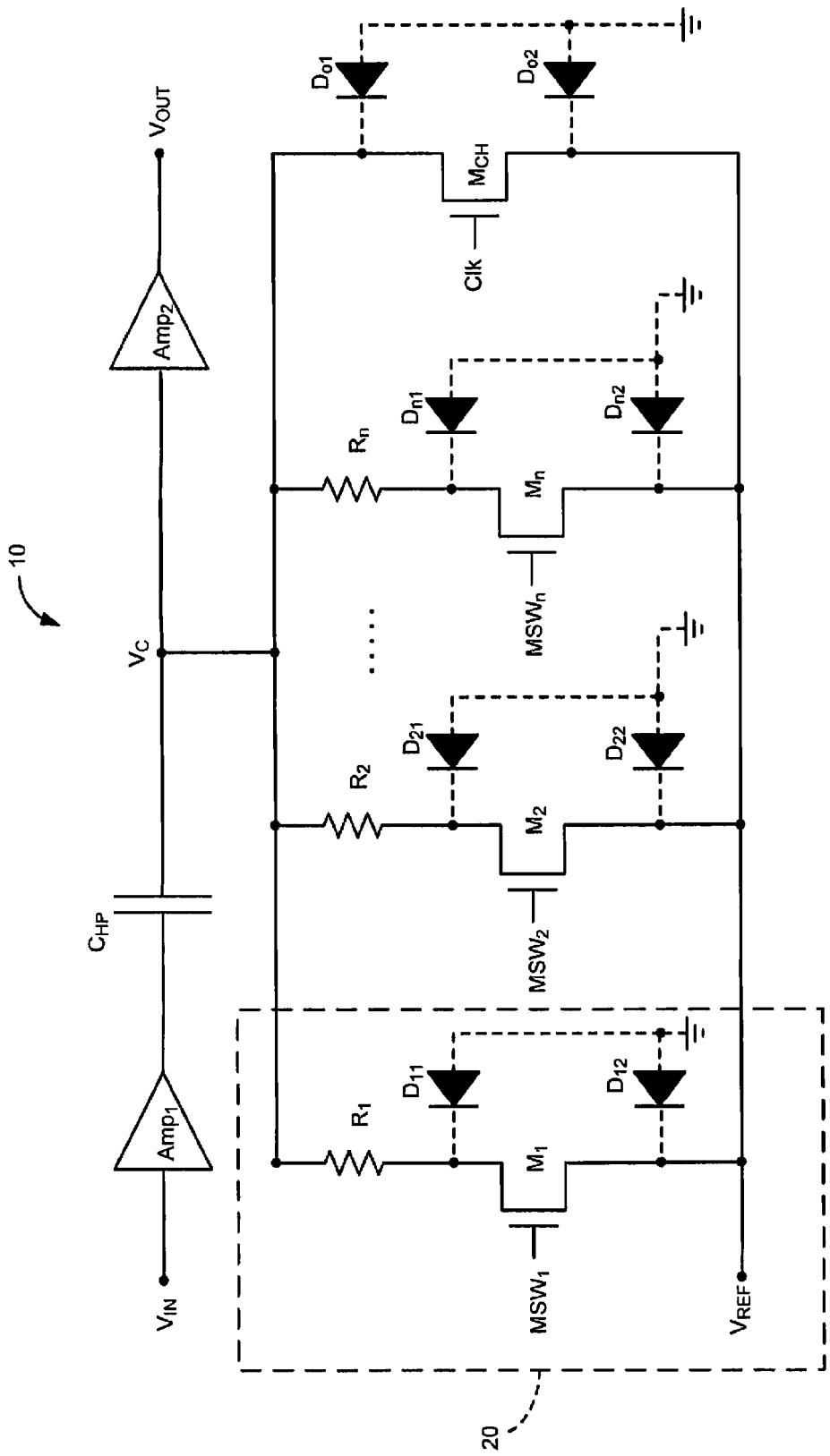
FIG. 1 is a circuit diagram of a high pass filter.
Figure 2:
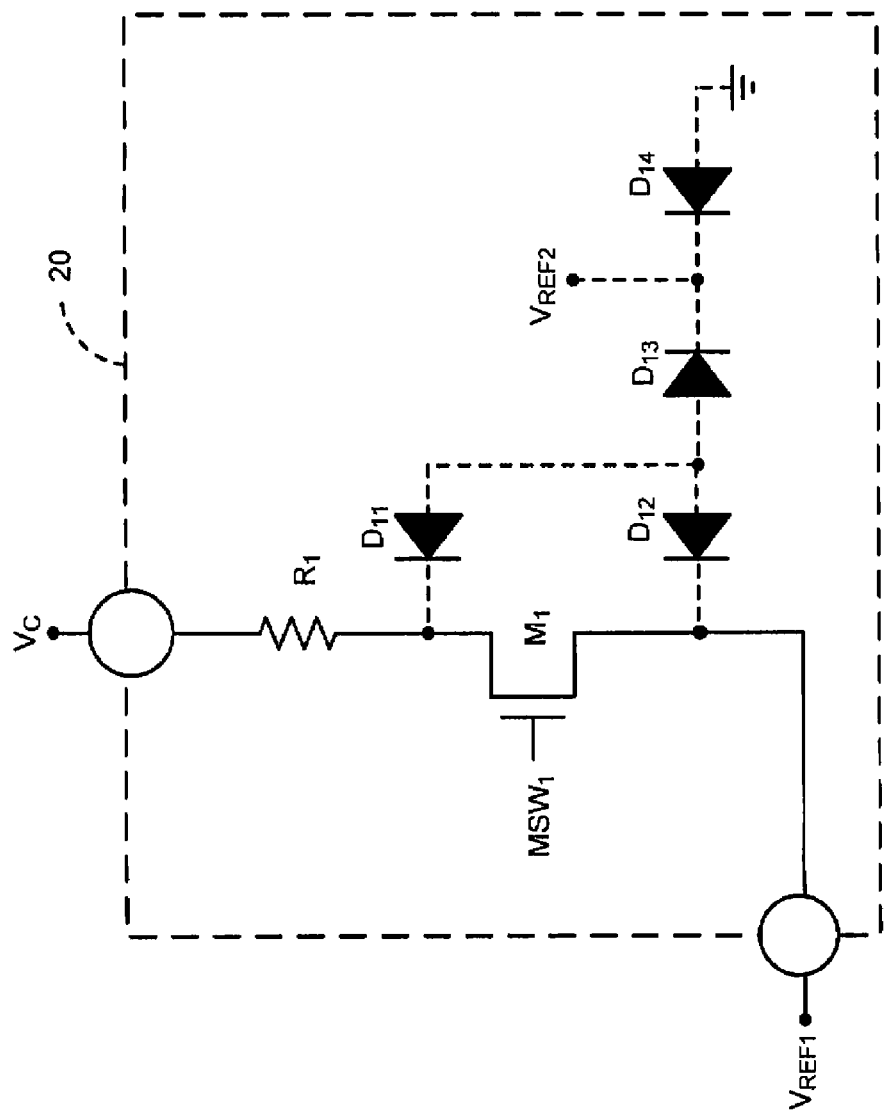
FIG. 2 is a circuit diagram of a bias network of the high pass filter of FIG. 1 using an NMOS transistor fabricated using a twin-well process.
Figure 3:
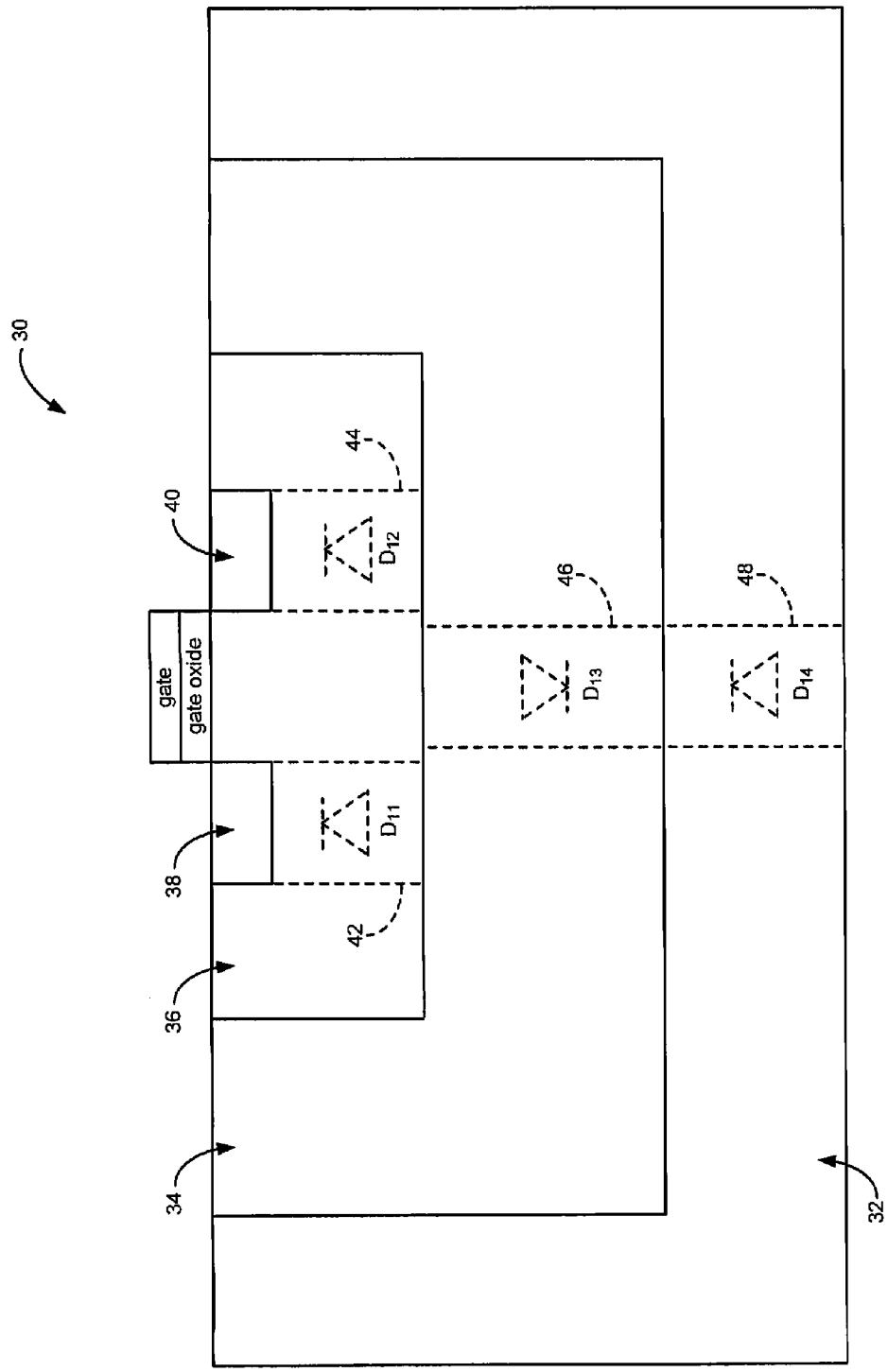
FIG. 3 is a cross-sectional diagram of an NMOS transistor fabricated using a twin-well process.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described function. As used herein, the phrase at least one of A, B, and C should be construed to mean a logical (A or B or C), using a non-exclusive logical or. It should be understood that steps within a method may be executed in different order without altering the principles of the present disclosure.

Figure 4:
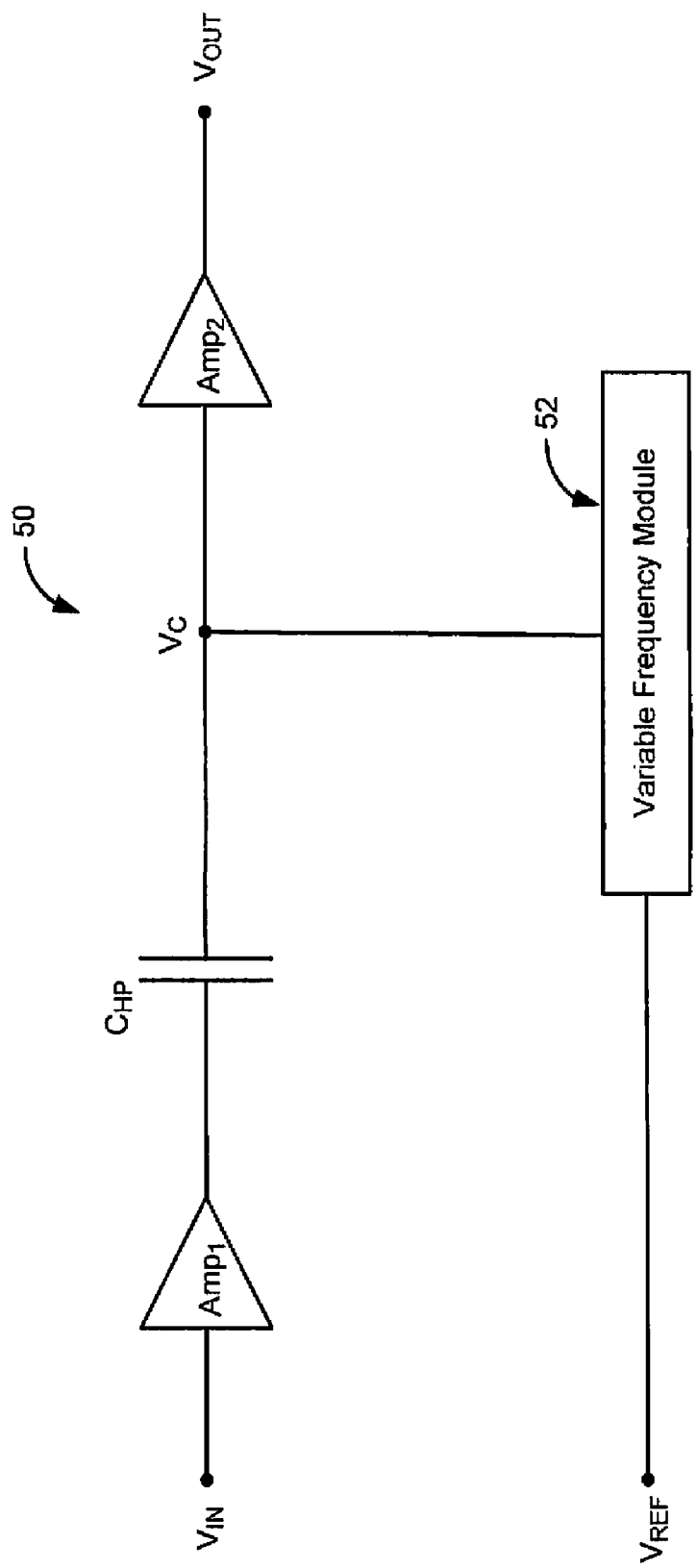
FIG. 4 is a circuit diagram of a high pass filter with a variable frequency control module.

Referring now to FIG. 4, a high-pass filter 50 with amplifiers $Amp_1$, $Amp_2$, and a variable frequency module 52 is shown. A capacitor $C_{HP}$ is connected to an output of $Amp_1$ and an input of $Amp_2$. Although the present implementation includes capacitor $C_{HP}$, those skilled in the art can appreciate that another capacitive element may be used. The variable frequency module 52 receives a reference voltage signal $V_{REF}$, and controls a resistive path of the high-pass filter 50. The variable frequency module 52 allows the high pass filter 50 to achieve a low cutoff frequency based on the connections of the inherent diodes. Normally, diodes $D_{11}, D_{21}, \ldots, D_{n1}$, $D_{12}, D_{22}, \ldots, D_{n2}, D_{o1}$, and $D_{o2}$ are connected to ground, which allows leakage current to drain capacitor $C_{HP}$. The variable frequency module 52 connects the anode of diodes $D_{11}, D_{21}, \ldots, D_{n1}$, and $D_{o1}$ to $V_{REF}$, effectively bypassing diodes $D_{21}, D_{22}, D_{n2}$, and $D_{o2}$. This connection prevents leakage current from draining capacitor $C_{HP}$, and helps hold $V_C$ by forward biasing diodes $D_{11}, D_{21}, \ldots, D_{n1}$, and $D_{o1}$ using $V_{REF}$. Therefore, by preventing this leakage current and holding $V_C$, the variable frequency module 52 creates a lower cutoff frequency for the high pass filter 50.

Figure 5:
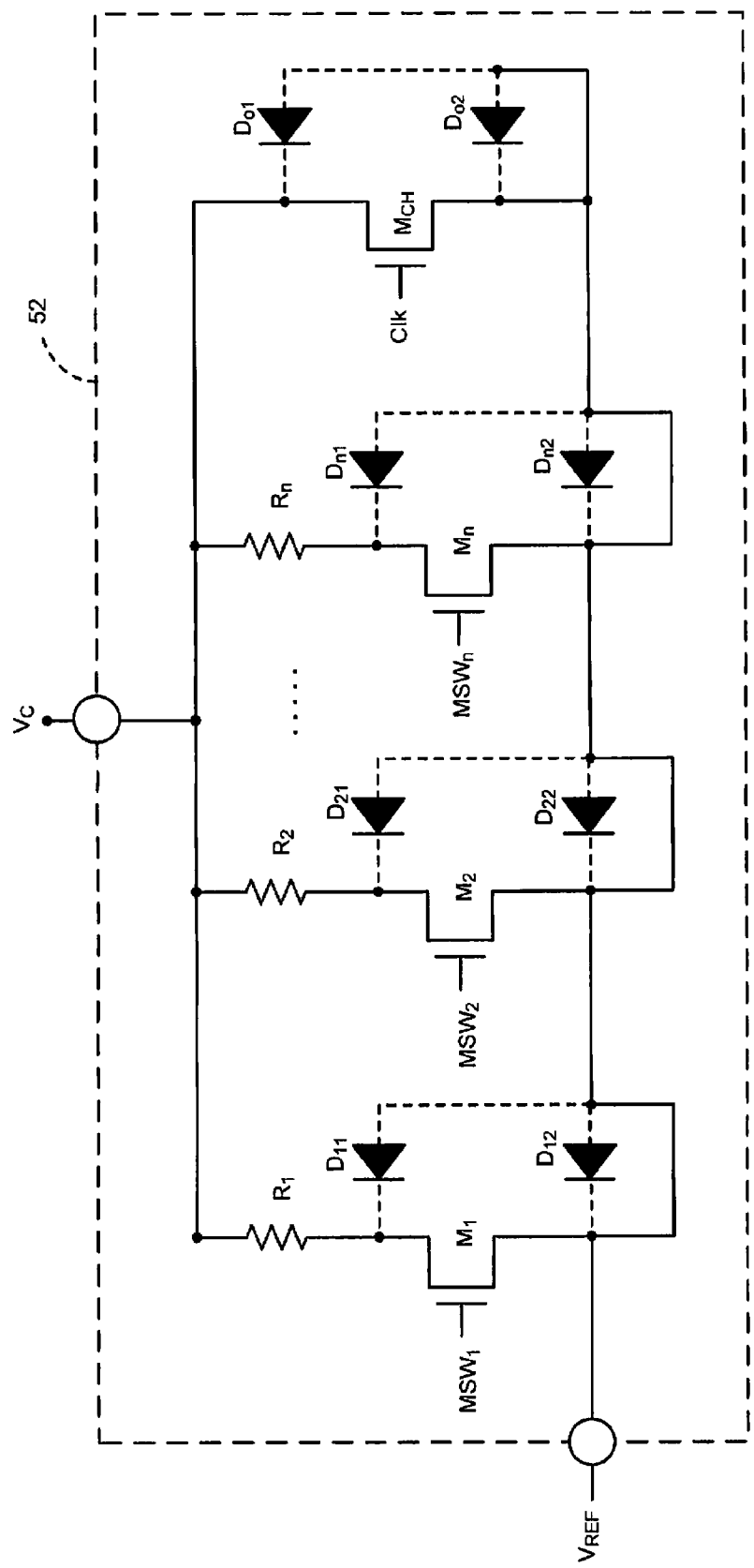
FIG. 5 is a circuit diagram of the variable frequency control module.

Referring now to FIG. 5, a circuit diagram of the variable frequency module 52 is shown. A communication node $V_C$ is connected to the first ends of resistors $R_1, R_2, \ldots,$ and $R_n$, the cathode of diode $D_{o1}$, and the source of transistor $M_{CH}$. Although the present implementation includes resistors $R_1$, $R_2, \ldots,$ and $R_n$, those skilled in the art can appreciate that other resistive elements may be used. The second ends of resistors $R_1$-$R_n$ are connected to the sources of transistors $M_1$, $M_2, \ldots,$ and $M_n$ and the cathodes of diodes $D_{11}, D_{21}, \ldots,$ and $D_{n1}$. The drains of transistors $M_1, M_2, \ldots, M_n$, and $M_{CH}$ are connected to the anodes of diodes $D_{11}, D_{21}, \ldots, D_{n1}, D_{21}, D_{22}, \ldots, D_{n2}, D_{o1}$, and $D_{o2}$ and to $V_{REF}$. These connections effectively bypass diodes $D_{21}, D_{22}, \ldots, D_{n2}$, and $D_{o2}$, preventing leakage current from draining $V_C$ and holding $V_C$ by forward biasing diodes $D_{11}, D_{21}, \ldots, D_{n1}$, and $D_{o1}$.

Control signals $MSW_1, MSW_2, \ldots,$ and $MSW_n$ control the various NMOS bias transistors $M_1, M_2, \ldots,$ and $M_n$, which open paths of different resistances based on the desired cutoff frequency of the high-pass filter. For example, a control module (not shown) may send a control signal that opens a path of higher resistance, which creates a lower cutoff frequency. The transistor $M_{CH}$, controlled by the clock signal CLK, is used to charge the capacitor $C_{HP}$ using voltage $V_{REF}$ during initialization. For example, the resistance through paths $R_1$, $R_2, \ldots,$ and $R_n$ may be too large, thereby increasing a time to charge capacitor $C_{HP}$. When each of $MSW_1, MSW_2, \ldots$, $MSW_n$, and $M_{ch}$ are off, the communication voltage signal $V_C$ is high impedance. When the diodes $D_{21}, \ldots,$ and $D_{n1}, D_{12}$, $D_{22}, \ldots,$ and $D_{n2}, D_{o1}$, and $D_{o2}$ are connected as shown in FIG. 1, node $V_C$ will drain off due to diode leakage current, which creates a higher cutoff frequency than is desired. When the diodes are connected as shown, the diodes do not drain current from node V. When the second diodes $D_{12}, D_{22}, \ldots$, $D_{n2}$, and $D_{o2}$ of each resistive path are bypassed, $V_{REF}$ forward biases the first diodes $D_{11}, D_{21}, \ldots, D_{n1}$, and $D_{o1}$. Instead of draining current from $V_C$, the first diodes $D_{11}$, $D_{21}, \ldots, D_{n1}$, and $D_{o1}$ help to maintain the voltage at node $V_C$ by supplying current.

Figure 6:
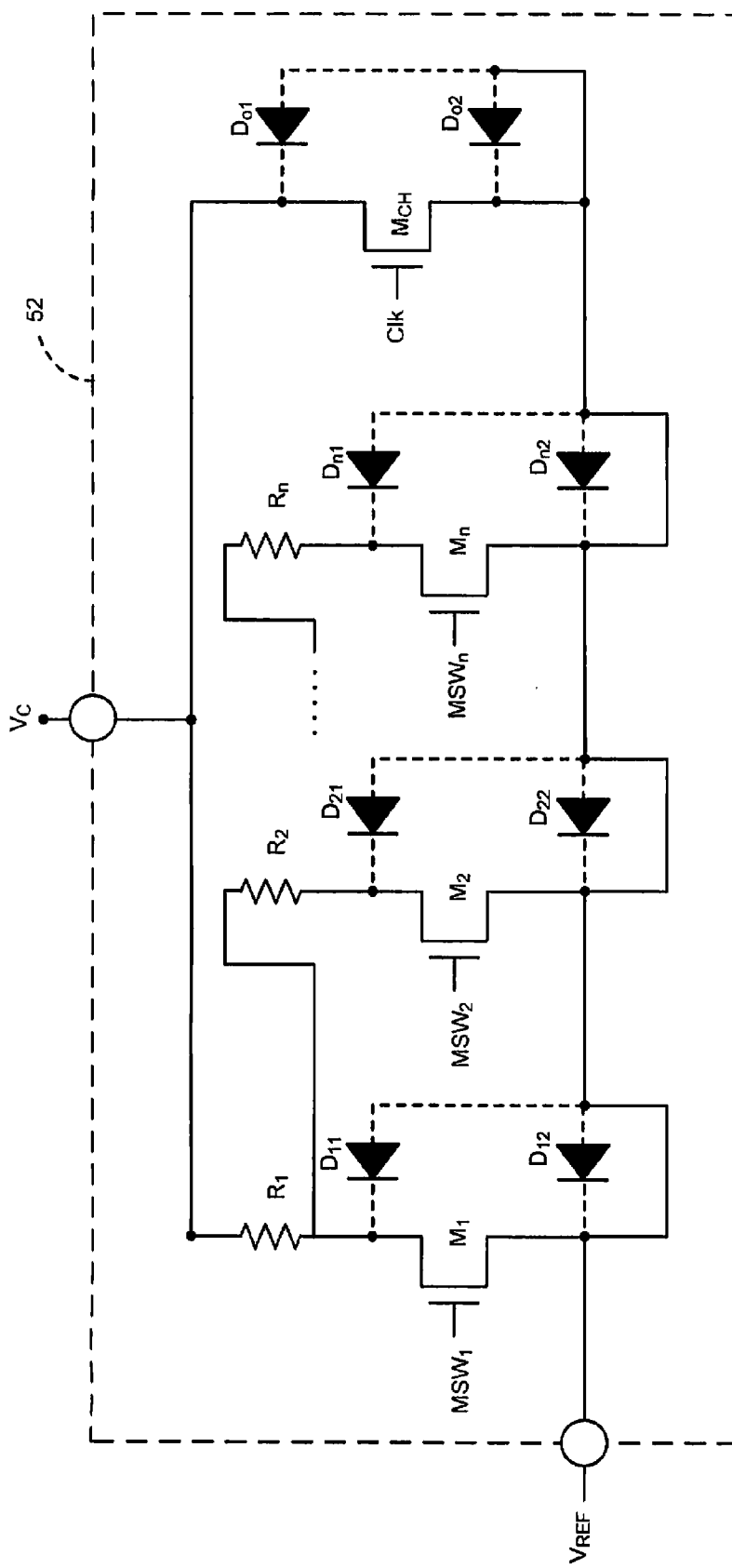
FIG. 6 is a circuit diagram of the variable frequency control module.

Referring now to FIG. 6, a circuit diagram of the variable frequency module 52 is shown with resistors $R_1, R_2, \ldots,$ and $R_n$ connected in a series pattern as opposed to the parallel pattern of FIG. 5. Communication node $V_C$ is connected to the first end of resistor $R_1$ and the cathode of diode $D_{o1}$, and the source of transistor $M_{CH}$. The first end of resistor $R_2$ is connected to the second end of resistor $R_1$. In general for n greater than or equal to 2, the first end of resistor $R_n$ is connected to the second end of resistor $R_{n-1}$ and the second end of resistor $R_n$ is connected to the cathode of diode $D_{n1}$ and the source of transistor $M_n$. The remaining elements and their associated connections, and the control signals $MSW_1$-$MSW_n$, are the same as shown in FIG. 5.

Figure 7A:
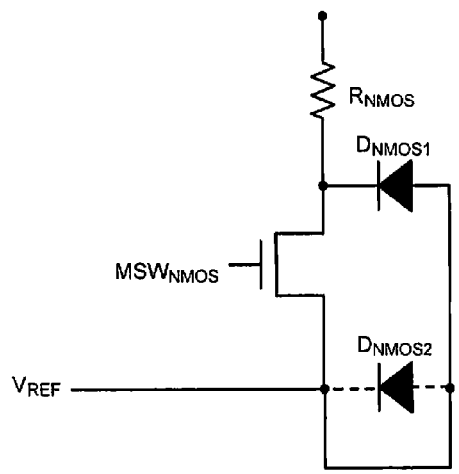
FIG. 7A is a circuit diagram of the diode connections required to implement the variable frequency module using NMOS technology.
Figure 7B:
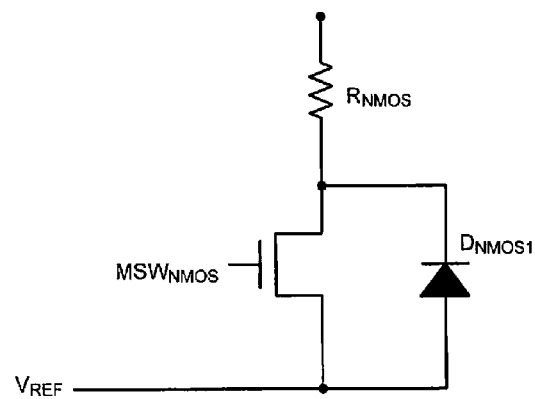
FIG. 7B is a circuit diagram representing the equivalent circuit after the connecting of the diodes of the variable frequency module using NMOS technology.

Referring now to FIGS. 7A-7B, diode connections for NMOS transistors are shown. In FIG. 7A, the connection of the diode $D_{NMOS1}$ bypasses diode $D_{NMOS2}$. In FIG. 7B, the equivalent connection is shown after bypassing diode $D_{NMOS2}$ (see FIG. 7A). Diode $D_{NMOS1}$ can now be forward biased to help maintain the voltage at capacitor $C_{HP}$ (see FIG. 4) by providing leakage current.

Figure 7C:
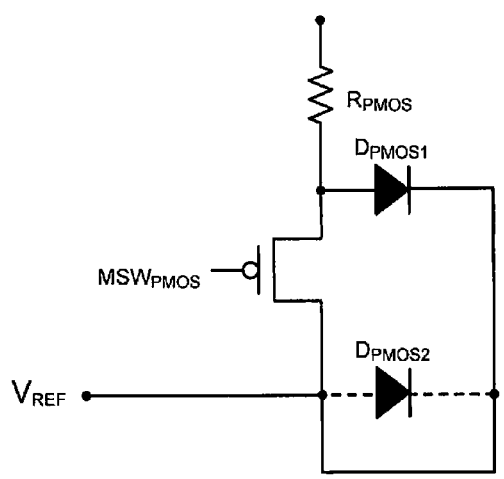
FIG. 7C is a circuit diagram of the diode connections required to implement the variable frequency module using PMOS technology.
Figure 7D:
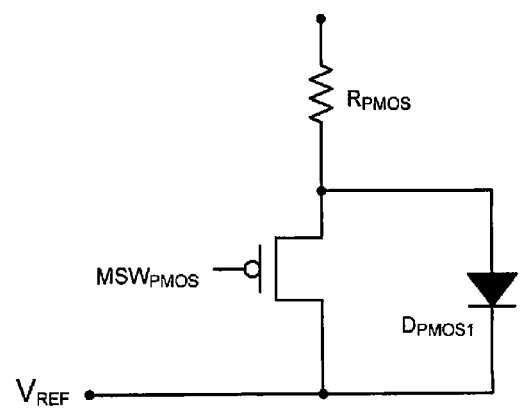
FIG. 7D is a circuit diagram representing the equivalent circuit after the connecting of the diodes of the variable frequency module using PMOS technology.

Referring now to FIGS. 7C-7D, diode connections for PMOS transistors are shown. In FIG. 7C, the connection of the diode $D_{PMOS1}$ bypasses diode $D_{PMOS2}$. In FIG. 7D, the equivalent connection is shown after bypassing diode $D_{PMOS2}$ (see FIG. 7C). Diode $D_{PMOS1}$, can now be reverse biased to help maintain the voltage at capacitor $C_{HP}$ (see FIG. 4) by providing reverse leakage current. This PMOS configuration can be used if the twin-well process is not available.

Figure 8:
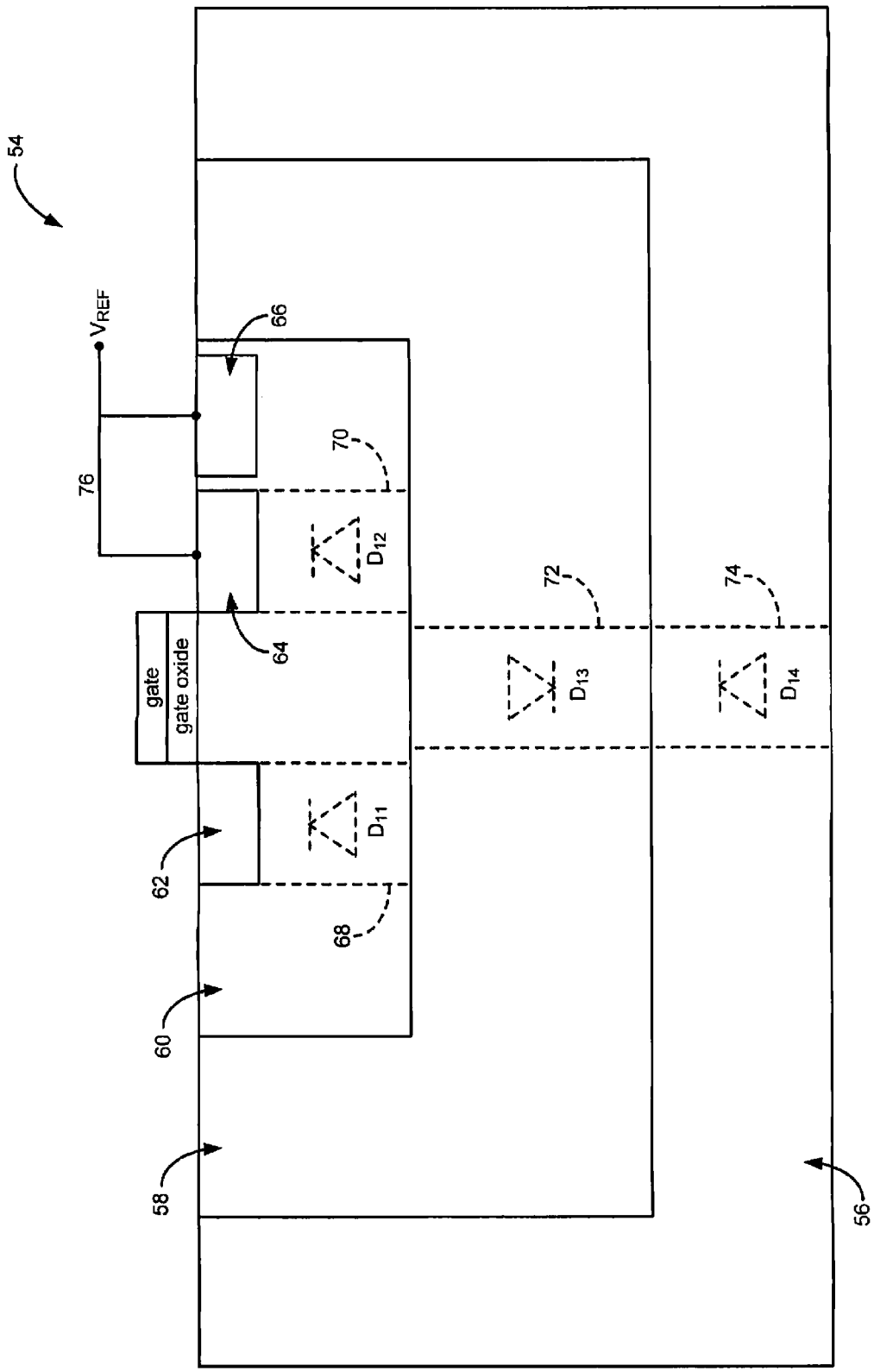
FIG. 8 is a cross-sectional diagram of an NMOS transistor fabricated using a twin-well process with a diode bypass connection.

Referring now to FIG. 8, a cross-sectional view of an NMOS transistor 54 created using a twin-well process with a diode bypass connection is shown. A deep n-well 58 is formed in a p-type substrate 56. A p-well 60 is formed in the deep n-well 58. An n+ source region 62 and an n+ drain region 64 are formed in the p-well 60. A p+ bulk contact 66 is formed in the p-well 60 near the drain region 64. Diodes $D_{11}$-$D_{14}$ are inherent in regions between n-type and p-type regions (i.e. p-n junctions). For example, current flows from the p-type side (the anode) to the n-type side (the cathode). In other words, a diode $D_{11}$ is inherently present in the region 68 between the source 62 and the p-well 60. Similarly, a diode $D_{12}$ is inherently present in the region 70 between the drain 64 and the p-well 60. A diode $D_{13}$ is inherently present in the region 72 between the p-well 60 and the deep n-well 58. A diode $D_{14}$ is inherently present in the region 74 between the deep n-well 58 and the p-type substrate 56.

The p+ bulk contact 66 is connected to the entire p-well 60. By connecting to the entire p-well 60, current can flow through the less resistive p+ bulk contact to p-well 60 path, as opposed to flowing through the more resistive n+ drain region 64 to p-well 60 path (diode $D_{12}$). Therefore, by electrically coupling the drain 64 and the p+ bulk contact 66 and connecting to $V_{REF}$ 76, diode $D_{12}$ is effectively bypassed, because the drain 64 is connected to the p-well bulk contact 66, which is connected to the anodes (the p-well bulk) of diodes $D_{11}$, $D_{12}$, and $D_{13}$.

Figure 9:
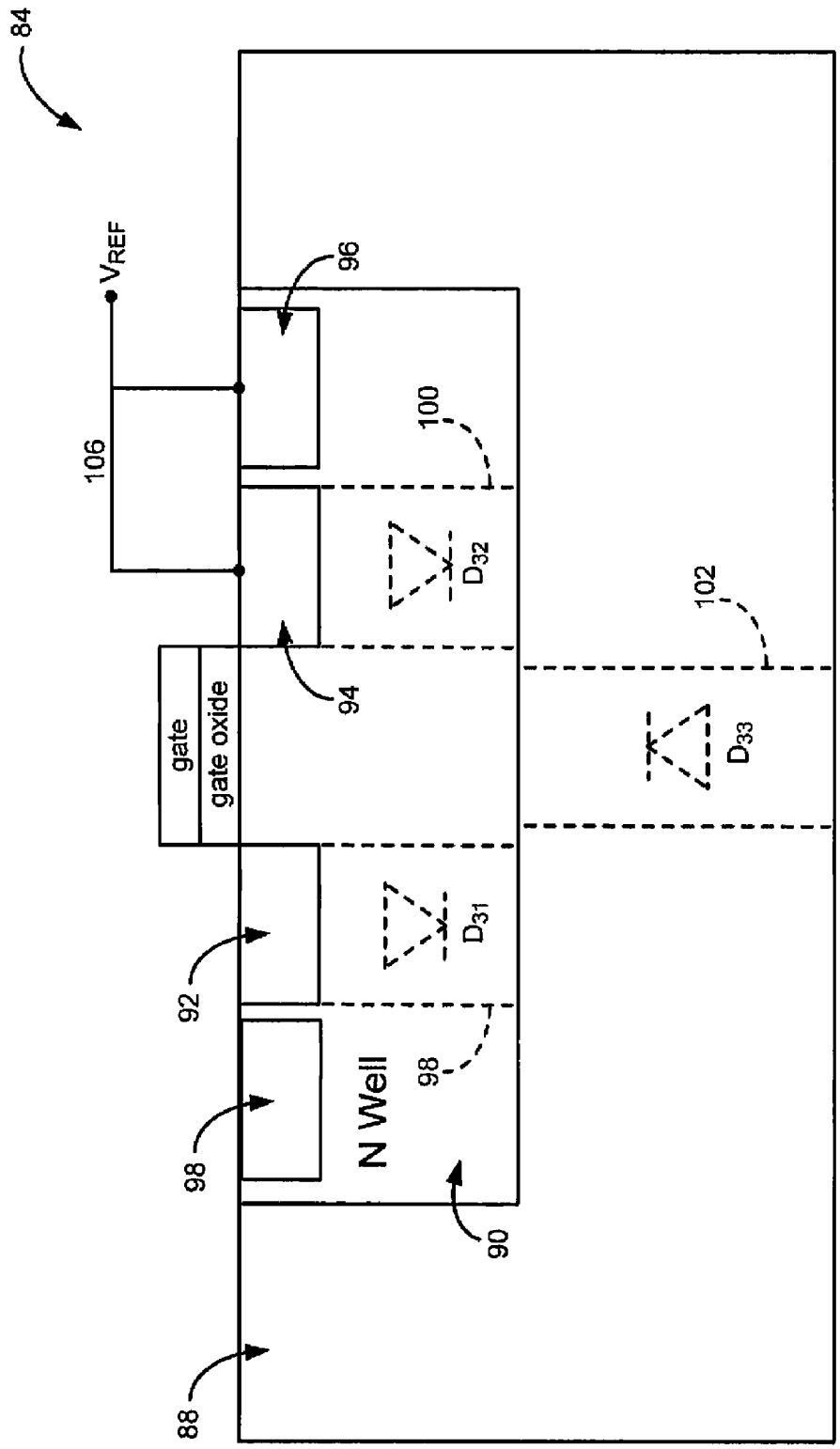
FIG. 9 is a cross-sectional diagram of a PMOS transistor fabricated using a twin-well process with a diode bypass connection.

Referring now to FIG. 9, a cross-sectional view of a PMOS transistor 84 created using the twin-well process with a diode bypass connection is shown. An n-well 90 is formed in a p-type substrate 88. A p+ source region 92 and a p+ drain region 94 are formed in the n-well 90. An n+ bulk contact 96 is formed in the n-well 90 near the drain region 94. An n+ bulk contact 98 is formed in the n-well near the source region 92. A diode $D_{31}$ is inherently present in the region 98 between the source region 92 and the n-well 90. Similarly, a diode $D_{32}$ is inherently present in the region 100 between the drain region 94 and the n-well 90. A diode $D_{33}$ is inherently present in a region 102 between the n-well 90 and the p-substrate 88.

Figure 10:
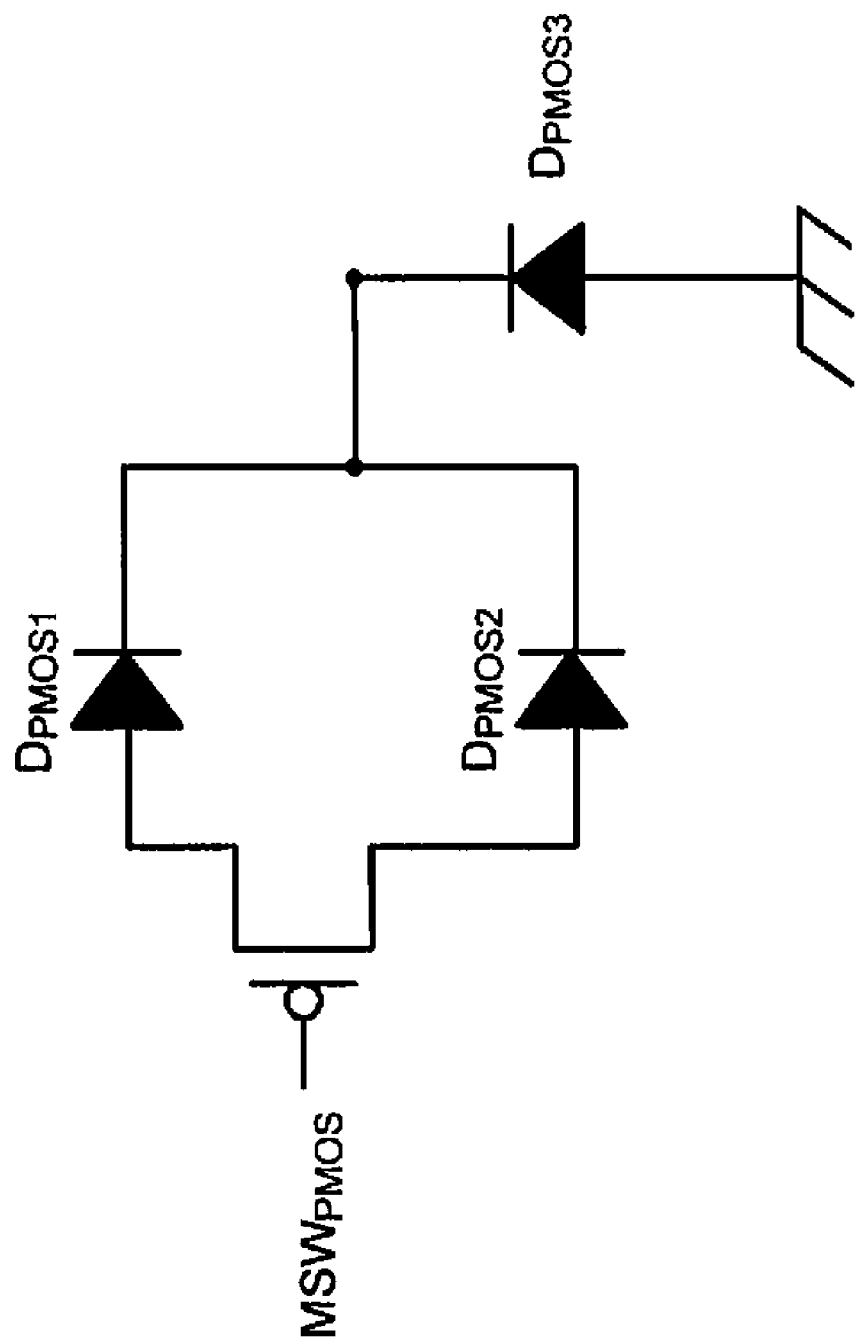
FIG. 10 is a circuit diagram representing the equivalent circuit after the connecting of the diodes of the variable frequency module using PMOS technology of FIG. 9.

Referring now to FIG. 10, diode connections for PMOS transistor 10 is shown. An anode of a diode $D_{PMOS1}$ connects to a source of an ideal transistor. An anode of a diode $D_{PMOS2}$ connects to a drain of the ideal transistor. Cathodes of diodes $D_{PMOS1}$ and $D_{PMOS2}$ are connected to a cathode of a diode $D_{PMOS3}$. An anode of diode $D_{PMOS3}$ connects to a reference voltage such as ground. Signal $MSW_{PMOS}$ communicates with a gate of the ideal transistor.

Figure 11B:
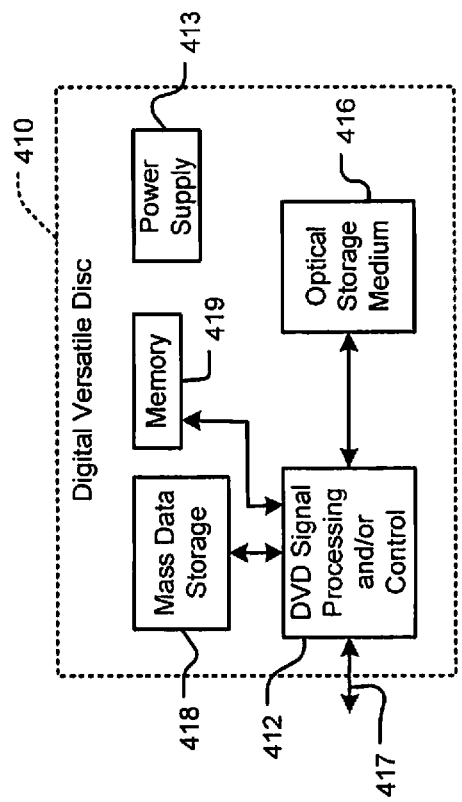
FIG. 11B is a functional block diagram of a digital versatile disk (DVD)
Figure 11A:
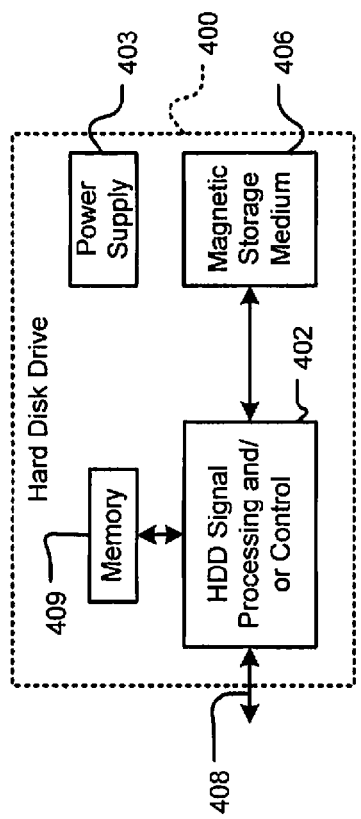
FIG. 11A is a functional block diagram of a hard disk drive.

Referring now to FIGS. 11A-11G, various exemplary applications are shown for the variable frequency module. Referring now to FIG. 11A, the variable frequency module can be implemented in high pass filters of a hard disk drive 400. The variable frequency module may be implemented in either or both signal processing and/or control circuits, which are generally identified in FIG. 5A at 402. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Referring now to FIG. 11B, the variable frequency module can be implemented in a digital versatile disc (DVD) drive 410. The variable frequency module may be implemented in high pass filters of signal processing and/or control circuits, which are generally identified in FIG. 11B at 412. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 11A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Referring now to FIG. 11C, the variable frequency module can be implemented in high pass filters of a high definition television (HDTV) 420. The device may be implemented in either or both signal processing and/or control circuits, which are generally identified in FIG. 11E at 422. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 11A and/or at least one DVD may have the configuration shown in FIG. 11B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 11D, the variable frequency module may implement and/or be implemented in high pass filters of a control system of a vehicle 430. In some implementations, the variable frequency module may be implemented in a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The variable frequency module may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner.

The mass data storage 446 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 11E:
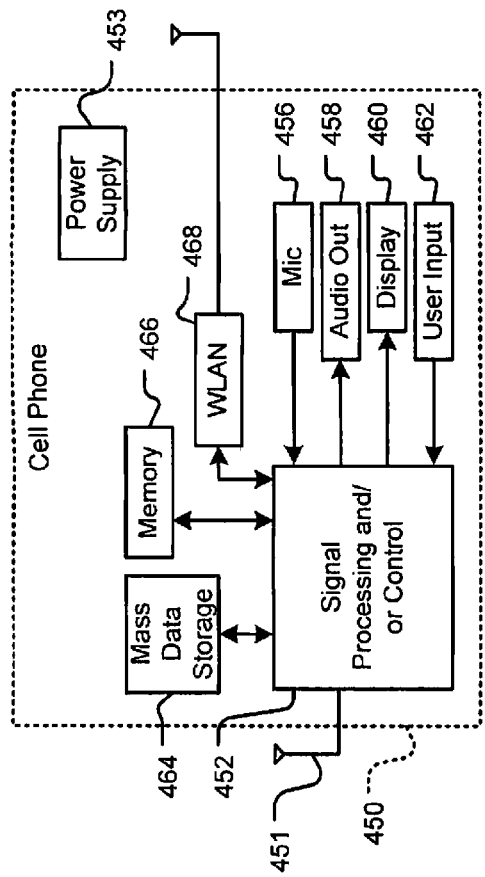
FIG. 11E is a functional block diagram of a cellular phone.

Referring now to FIG. 11E, the variable frequency module can be implemented in high pass filters of a cellular phone 450 that may include a cellular antenna 451. The variable frequency module may implement and/or be implemented in either or both signal processing and/or control circuits, which are generally identified in FIG. 11E at 452. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 11F:
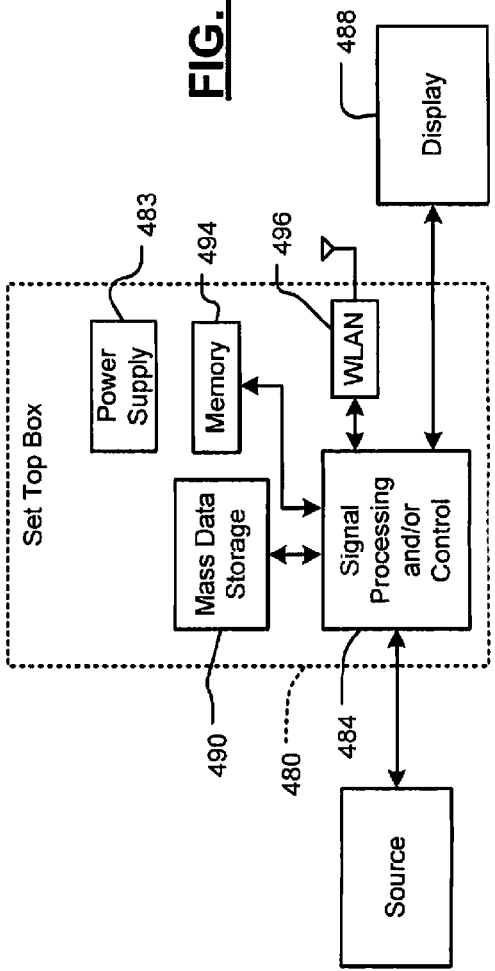
FIG. 11F is a functional block diagram of a set top box.

Referring now to FIG. 11F, the variable frequency module can be implemented in high pass filters of a set top box 480. The variable frequency module may implement and/or be implemented in either or both signal processing and/or control circuits, which are generally identified in FIG. 5E at 484. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 11G:
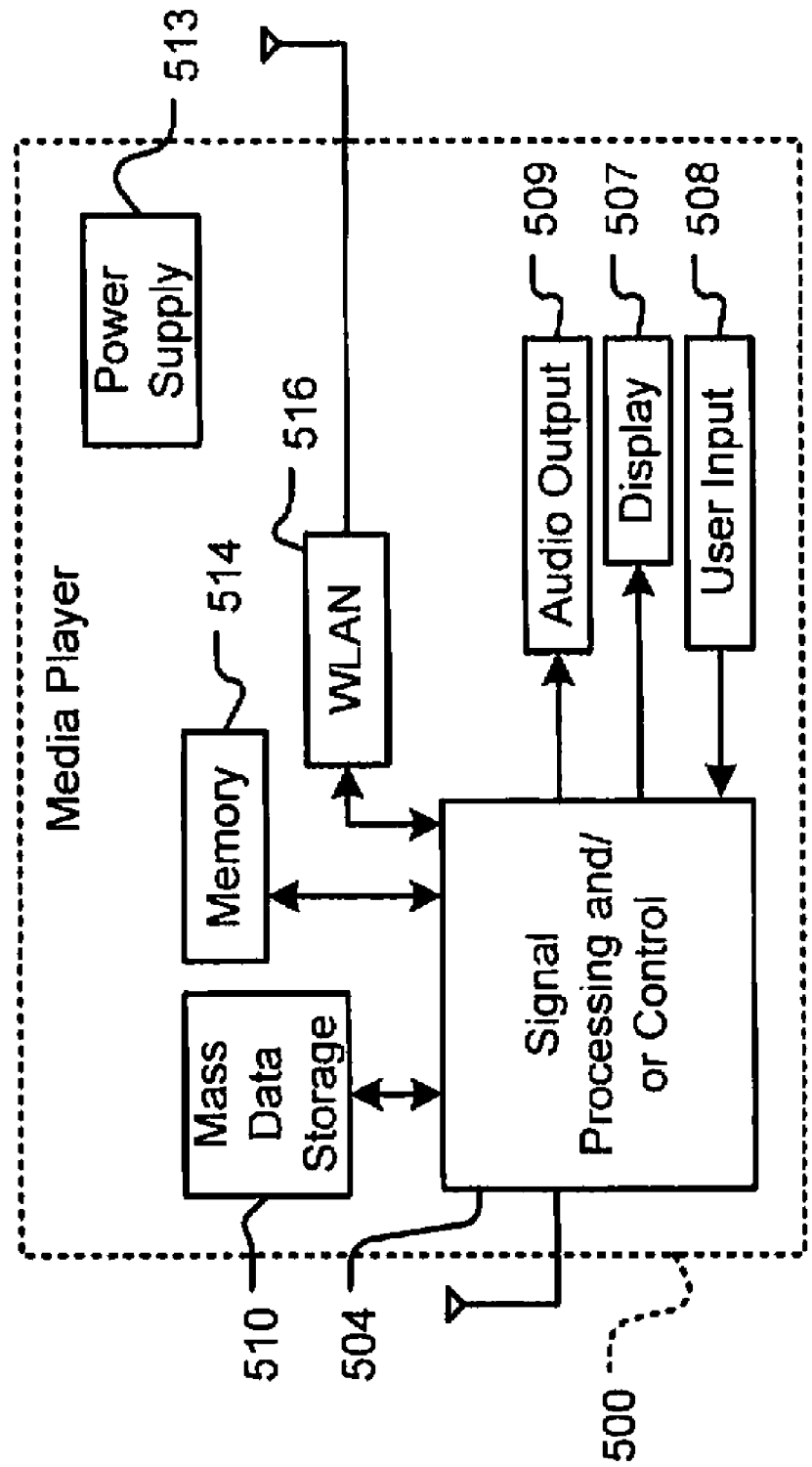
FIG. 11G is a functional block diagram of a media player.

Referring now to FIG. 11G, the variable frequency module can be implemented in high pass filters of a media player 500. The variable frequency module may implement and/or be implemented in either or both signal processing and/or control circuits, which are generally identified in FIG. 11G at 504. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A high pass filter having a cutoff frequency, the high pass filter comprising:
   a first amplifier to receive an input signal, the high pass filter to attenuate low frequency signals of the input signal that are below the cutoff frequency;
   a second amplifier to provide an output signal, the output signal comprising only high frequency signals of the input signal that are above the cutoff frequency;
   a capacitive element coupled in between the first amplifier and the second amplifier; and
   a variable frequency module communicating with the capacitive element and including a plurality of resistive paths of the high pass filter,
   wherein each resistive path corresponds to a different cutoff frequency for the high pass filter,
   wherein the variable frequency module comprises i) a first transistor having a first source/drain region formed in a first well region and ii) a first diode region formed between the first source/drain region and the first well region, wherein a first node of the first diode region is connected to the first source/drain region and a reference node, wherein a second node of the first diode region is connected to the reference node, and wherein the variable frequency module is configured to prevent any leakage current from draining the capacitive element.

2. The high pass filter of claim 1, wherein the variable frequency module comprises:
a resistive element configured to communicate with the capacitive element of the high pass filter.

3. The high pass filter of claim 2, wherein the first transistor further includes:
a first contact region formed in the first well region that is connected to the first source/drain region and the first well region.

4. The high pass filter of claim 3, wherein the first transistor further includes:
a second diode region formed between a second source/drain region and the first well region,
wherein a first node of the second diode region is connected to the second source/drain region, and a second node of the second diode region is connected to the second node of the first diode region and the reference node.

5. The high pass filter of claim 2, further comprising:
a second transistor configured to communicate with the capacitive element and the reference node, the second transistor including:
a second source/drain region formed in a second well region; and
a second diode region formed between the second source/drain region and the second well region,
wherein a first node of the second diode region is connected to the second source/drain region and the reference node, and a second node of the second diode region is connected to the reference node.

6. The high pass filter of claim 5, wherein the second transistor further includes:
a second contact region formed in the second well region, the second well region being connected to the second source/drain region.

7. The high pass filter of claim 6, wherein the second transistor further includes:
a third diode region formed between a third source/drain region and the second well region,
wherein a first node of the third diode region is connected to the third source/drain region, and a second node of the third diode region is connected to the second node of the second diode region and the reference node.

8. The high pass filter of claim 5, wherein the first transistor and the second transistor are fabricated via a twin-well process.

9. The high pass filter of claim 2, wherein the variable frequency module communicates with a reference voltage.

10. The high pass filter of claim 9, wherein the reference node communicates with the reference voltage.

11. The high pass filter of claim 2, wherein the first transistor receives a control signal.

12. The high pass filter of claim 5, wherein the second transistor receives a clock signal.

13. The high pass filter of claim 1, wherein the variable frequency module comprises:
a resistive element configured to communicate with the capacitive element of the high pass filter; and
a first contact region formed in the first well region, wherein the first contact region is connected to the first source/drain region, the first well region, and the reference node.

14. The high pass filter of claim 13,
wherein the resistive element comprises N resistors,
wherein the variable frequency module further comprises N−1 transistors wherein first ends of each of the N resistors are connected together,
wherein second ends of each of the N resistors communicate with a respective one of the N−1 transistors, and
wherein N is an integer greater than or equal to 2.

15. The high pass filter of claim 13, further comprising:
N additional resistive elements configured to communicate with the capacitive element; and
N additional transistors that each include a second source/drain region formed in a second well region, a second diode region formed between the second source/drain region and the second well region, and a second contact region formed in the second well region,
wherein a first end of each of the N additional resistive elements connects to an associated one of the N additional transistors, and a second end of each of the N additional resistive elements connects to an adjacent one of the N additional transistors, and
wherein N is an integer greater than or equal to 1.

16. The high pass filter of claim 13, wherein the first transistor is an NMOS transistor.

17. The high pass filter of claim 13, wherein the first transistor is a PMOS transistor.

* * * * *